United States Patent
Rana et al.

(10) Patent No.: US 10,483,416 B2
(45) Date of Patent: Nov. 19, 2019

(54) MEDIUM WAVE INFRARED (MWIR) AND LONG WAVELENGTH INFRARED (LWIR) OPERATING MICROBOLOMETER WITH RAISED STRUT DESIGN

(71) Applicants: Mukti Rana, Dover, DE (US); Andrew Bodhi Voshell, Felton, DE (US)

(72) Inventors: Mukti Rana, Dover, DE (US); Andrew Bodhi Voshell, Felton, DE (US)

(*) Notice: Subject to any disclaimer, the term of this patent is extended or adjusted under 35 U.S.C. 154(b) by 96 days.

(21) Appl. No.: 15/792,239

(22) Filed: Oct. 24, 2017

(65) Prior Publication Data

US 2019/0123214 A1    Apr. 25, 2019

(51) Int. Cl.
*H01L 31/024* (2014.01)
*H01L 31/09* (2006.01)
*H01L 31/18* (2006.01)
*H01L 31/0352* (2006.01)
*G01J 5/20* (2006.01)
*G01J 5/02* (2006.01)

(52) U.S. Cl.
CPC .......... *H01L 31/024* (2013.01); *G01J 5/0225* (2013.01); *G01J 5/20* (2013.01); *H01L 31/0352* (2013.01); *H01L 31/09* (2013.01); *H01L 31/18* (2013.01)

(58) Field of Classification Search
CPC ....................................................... H01L 31/024
See application file for complete search history.

(56) References Cited

U.S. PATENT DOCUMENTS

| | | | | |
|---|---|---|---|---|
| 4,966,037 | A * | 10/1990 | Sumner | G01F 1/696 438/52 |
| 6,201,243 | B1 * | 3/2001 | Jerominek | G01J 5/20 250/332 |
| 6,307,194 | B1 * | 10/2001 | Fitzgibbons | G01J 5/20 250/208.1 |

(Continued)

OTHER PUBLICATIONS

Muztoba et al. ,Design and simulation of pyroelectric detectors with nanometer size spider-web for low thermal conductance, Mycrosyst Technol (2015) 23;687-694 (Year: 2015).*

(Continued)

*Primary Examiner* — David P Porta
*Assistant Examiner* — Djura Malevic (57) ABSTRACT

A semiconducting microbolometer sensor for detecting electromagnetic waves in the medium wavelength infrared (MWIR) and long-wavelength infrared (LWIR) is provided. A preferred embodiment provides a substrate layer, a bottom and top support structure with a strut-based mesh design, a meandered electrode layer that follows the top support structure design, a bolometer sensing material with a high TCR, and a disk-shaped absorber on top of the sensing material to maximize the heat flux absorption on the sensor. The bottom support of the sensor suspends the top support mesh, creating an air cavity. This air cavity along with the strut based mesh design and optimized thickness, dimension and shape of the layers contributed towards minimizing the thermal conductance of microbolometer and hence improved the figures of merits—responsivity, detectivity, noise equivalent power and noise equivalent temperature difference of microbolometer.

42 Claims, 10 Drawing Sheets

(56) References Cited

U.S. PATENT DOCUMENTS

| | | | | |
|---|---|---|---|---|
| 6,448,557 B2* | 9/2002 | Oda | ............................ | G01J 5/02 |
| | | | | 250/330 |
| 7,180,063 B2* | 2/2007 | Wada | ......................... | G01J 5/20 |
| | | | | 250/330 |
| 8,440,973 B1* | 5/2013 | Fernandez | ................. | G01J 5/40 |
| | | | | 250/338.4 |
| 8,835,861 B1* | 9/2014 | Cabrera | ................ | B81B 3/0024 |
| | | | | 250/338.4 |
| 9,533,875 B2* | 1/2017 | Han | ......................... | B81B 7/007 |
| 2001/0028035 A1* | 10/2001 | Iida | ............................ | G01J 5/10 |
| | | | | 250/338.4 |
| 2003/0052271 A1* | 3/2003 | Fedder | ...................... | G01J 5/02 |
| | | | | 250/338.4 |
| 2009/0140145 A1* | 6/2009 | Ouvrier-Buffet | ......... | G01J 5/02 |
| | | | | 250/338.1 |
| 2014/0091217 A1* | 4/2014 | Oulachgar | .............. | G01J 5/023 |
| | | | | 250/338.3 |

OTHER PUBLICATIONS

Zhang et al.,Research on Effective Thermal Conductance of the Microbolometer, International Conference on Artificial Intelligence and Industrial Engineering (AIIE 2015) pp. 601-604. (Year: 2015).*

* cited by examiner

FIG 2B [Taken at AA']

MEDIUM WAVE INFRARED (MWIR) AND LONG WAVELENGTH INFRARED (LWIR) OPERATING MICROBOLOMETER WITH RAISED STRUT DESIGN

TECHNICAL FIELD

This invention reports the design and fabrication of a microbolometer which operates in MWIR (3 to 5 µm) and LWIR (8 to 14 µm) wavelengths for detecting infrared (IR) radiation. These types of IR detectors operate in room temperature without external or cryogenic cooling.

BACKGROUND OF THE INVENTION

Thermal IR detectors are heated by the incident IR radiation and provide detection through the change in a measurable parameter. They are used in contact-less temperature measurement, night vision cameras for defense, security and surveillance applications, search and rescue and many other thermal imaging applications. For these types of detectors, wavelengths of interest are mainly in the atmospheric windows—ranging from 3 to 5 (MWIR) and 8 to 14 (LWIR) µm wavelength ranges, due to the high transmission through atmospheric air of more than 80% and peak IR emission of room temperature bodies is at 9-10 µm of wavelengths. Until recently, the important market of thermal imaging was mostly made of semiconductor-based, cooled quantum devices which measure photon intensity by electron-hole pair generation. The sensitivity and abilities of these quantum detectors far surpassed thermal detectors, leaving them only useful for a small group of low-cost, low performance products. To achieve better results of thermal detectors, the thermal properties of the device needed to be enhanced.

Figure 1A:
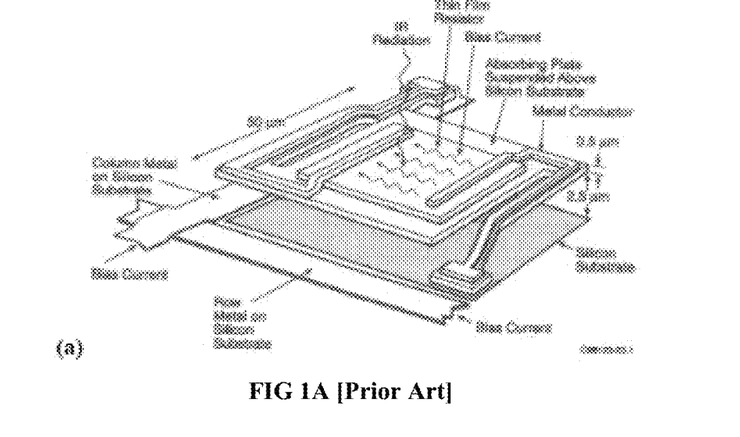
FIG. 1A is the front view of the microbolometers currently being used (prior art).
Figure 1B:
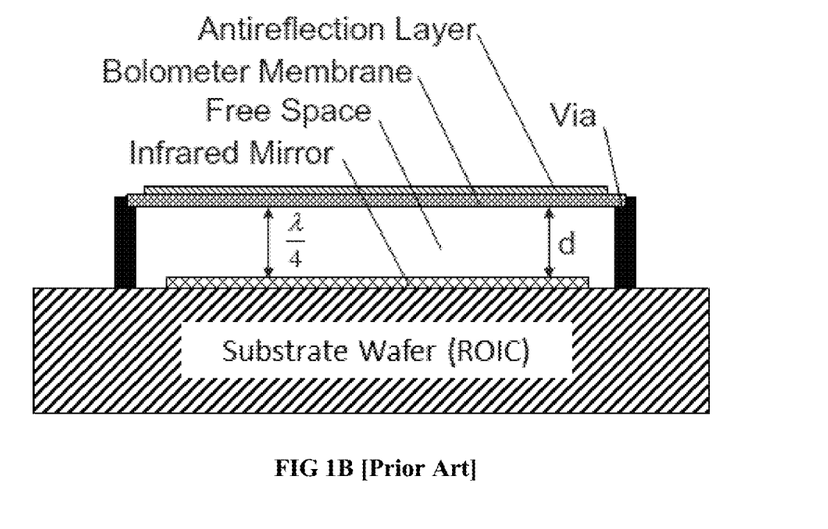
FIG. 1B is the cross-sectional view of the microbolometers currently being used (prior ar FIG. 2A is the 3D view of the individual bolometer design, showing the raised mesh design of the support layer.

Current microbolometer technology uses serpentine structured electrode arms (See FIG. 1, prior art) suspended on top of the substrate by using surface micromachining technique. The minimum reported thermal conductance using this method is $1 \times 10^{-7}$ W/K. Since the performance of the microbolometer and its figures of merits such as responsivity, detectivity and noise equivalent temperature difference (NETD) depend on the value of thermal conductance; reduction of thermal conductance will improve the figures of merits. By using an improved and new design, this invention reports the improved figures of merits and better performance of a microbolometer. With the advent of new nano and micro fabrication techniques such as nano-imprinting or electron beam lithography, structures less than or around 100 nm feature size can be patterned. To take advantage of this technology, the current invention includes the use a design which includes nano-meter size studs to reduce the thermal conductance at least an order of magnitude than the current state-of-the-art.

SUMMARY OF THE INVENTION

The microbolometer encompasses a change in resistance on the sensing material due to absorption of heat flux on the detector, causing a change across the sensing material's resistance to be measured across the electrodes. Using a cavity layer followed by a mesh support structure minimizes the thermal conductance of the device—allowing the effective thermal conductance to be governed by the radiation over the detector.

This invention describes a design and method of fabricating a microbolometer, which comprising of: providing a substrate, forming an insulating layer on the substrate, forming a lower cavity on the insulating layer, forming a lower support layer on the insulating layer, forming an upper support layer on the lower support layer and the lower cavity, forming a sensing layer on the upper support layer, forming an upper cavity on the upper support layer, forming an absorption layer on the upper support layer.

The microbolometer will be fabricated on a substrate which serves as the base of the microbolometer device. The substrate is made of Si, Polymer, GaAs, Ge, $Al_2O_3$ or other substrate material and has a thickness between 100 µm and 1000 µm.

On top of the substrate an insulation layer will be deposited after cleaning the substrate. The insulating layer has a thickness between 0.1 µm and 3 µm and is made of silicon oxide and/or silicon nitride due to their excellent insulation properties. The insulating layer will be deposited by sputtering or thermal oxidation or any other standard methods of thin film deposition.

On top of the insulation layer the first sacrificial layer will be deposited which will be ashed at the end of the fabrication steps to form the first cavity. The sacrificial layer will be patterned by photolithography to form a base for the upper support layer. The lower cavity is formed using the sacrificial layer of polymer, SiN or other material; and has a height between 2 µm and 4 µm.

The invention has support layers which is comprised of two stages. The first is a bottom support structure, creating the outer walls of the cavity which touches the substrate. The second is the mesh structure, creating an air cavity and minimizing the thermal conductance of the device struts to transfer heat away from the sensing layer to the substrate. Both support structures will be fabricated using e-beam lithography. The lower support layer is formed on top of the insulating layer by electron beam lithography while the upper support layer is fabricated by electron beam lithography on top of the lower support layer, and forming the lower cavity between the upper support layer and the insulating layer. The lower support layer and the upper support layers are made of insulating material having low thermal conductance, and transmittance of the lower support layer and the upper support layer is at least 60% between the wavelength ranges 0.2 µm to 7 µm. The upper support layer is on the lower support layer above an air cavity and is made of $Al_2O_3$, SiN or an insulating material. The upper support layer is a mesh like design structure made of $Al_2O_3$, SiN or an insulating material. The upper support layer has a thickness of 1 µm and a critical dimension between 60 nm and 120 nm and includes about 50 to 100 struts to minimize thermal conductance of the device below $5 \times 10^{-9}$ W/K. The microbolometer lower support layer has a thickness of 2 µm and a critical dimension between 60 nm and 120 nm.

The second sacrificial layer is fabricated by depositing the material on top of the second support layer and will be patterned by photolithography and the height of the upper support layer is in line with the top of the sensing layer in order to form a base for fabricating an absorber layer disk and the second sacrificial layer is removed at the end of the fabrication steps. The upper cavity is formed using the sacrificial layer of polymer, SiN or other material.

The sensing layer is on top of the upper support layer between two electrodes. The sensing material has high TCR, low resistivity and stable IR radiation. The sensing material is selected from Vanadium Oxide, Tungsten doped Germanium Silicon Oxide, Silicon Germanium oxide, Amorphous Silicon or combination of any of these materials due to their high TCR and absorption, positioned between the top electrodes and the absorber.

The semiconductor microbolometer comprising a top electrode; and the top electrode is made of material which has high electrical conductivity but low thermal conductivity. Here, top electrode layer could be Ti, NiCr, Cu, Au, or any electrically conductive metal, and is about 0.5 µm in thickness and a critical dimension is between 60 nm and 120 nm.

Top electrode has the same critical dimension as the supporting layer of 100 nm, and is meandered following the mesh structure, further reducing direct heat conduction from the sensing layer to the substrate. The electrodes are formed on top of the upper support layer using electron beam lithography, and positioned between the sensing layer and extending in a meandered shape, tracing the top support design to the ends of the detector design.

In a preferred embodiment, the semiconducting microbolometer has an absorption layer which has high absorption in MWIR and LWIR regions. The absorber layer of disk shape is positioned on top of the sensing layer. The absorber layer is made of NiCr or Au-black in a disk shape, with a thickness of about 0.2 µm and a diameter of 25 µm. The absorber layer is fabricated using photolithography with a sacrificial layer. The absorber layer provides a larger surface area than the sensing layer, providing a larger heat flux falling on the device.

The semiconducting microbolometer comprising of bondpads and the bondpads are formed with high electrical conductive material. The two bond pads positioned on opposite sides of the detector on the insulating layer.

Advantages of this invention includes a sensitive microbolometer to operate in the MWIR (3-5 µm) and LWIR (8-14 µm) with minimized thermal conductance lower than the required value of $5 \times 10^{-9}$ W/K to have a dominate radiation conductance of approximately $5 \times 10^{-8}$ W/K, allowing a semiconducting microbolometer device with very high sensitivity.

The invention includes the approach of reducing the thermal conductance between the substrate and the sensing layer by reducing the thickness of the electrode layer and making the electrode layer shape meandered. Smaller thickness of metal electrode layer led to smaller cross-sectional area which provided a higher thermal resistance for conductive heat to flow. By changing the shape of the metal electrode layer meandered, the path length of the electrodes is increased for heat to conduct and thus the heat through these metal electrodes was reduced along with the supporting structure and contributed towards decrease in thermal conductance.

This work includes a thicker sensing layer which provided longer thermal path—that way it helped in temperature rise due to IR absorption which reduced the thermal conductance. The design made a balance between the increase in thermal mass because of thicker sensing layer which tends to increase thermal conductance and meandered shaped electrode layer. The lower thermal conductance was found with increasing sensing layer thickness at the end.

In this work, a thinner web structure was used which reduces the cross-sectional area of web structure and increases the thermal resistance of conductive heat flow. The decrease in thermal conductance was obtained by decreasing the thickness of the mesh structure. The decrease in thermal conductance was also obtained by decreasing the width of the strut.

In current work, the thermal conductance obtained from the design is $1 \times 10^{-9}$ W/K which is at least one order of magnitude less than the current reported values for thermal conductance of semiconducting uncooled microbolometers.

DETAILED DESCRIPTION OF THE PREFERRED EMBODIMENT

Various example embodiments will be described more fully hereinafter with reference to the accompanying drawings, in which some example embodiments are shown. Example embodiments may, however, be embodied in many different forms and should not be construed as limited to the example embodiments set forth herein. In the drawings, the sizes and relative sizes of layers and regions may be exaggerated for clarity.

In other example embodiments mentioned hereinafter describes some objects or layers as located above others, using terms such as "on top of" or "above". Such example embodiments may be referring to any layer located above the first mentioned layer, but not necessarily the adjacent or closest layer to the original object. For example, a layer of material referred to as "above" another layer may be located directly above the original layer or several layers above the original layer.

For microbolometers made of semiconducting sensing layers (semiconducting microbolometers), thermal change on a material with a high temperature coefficient of resistance (TCR) causes a change in electrical resistance, thus allowing a measurable parameter across the detector with heating and cooling. Once the microbolometer sensing layer's temperature changes, there are three possible mechanisms of heat loss. First, heat is lost through conduction/convection through the atmosphere surrounding the detector thermometer. This is minimized by vacuum packaging the detectors. Today, it has been a common practice to include the wafer-level vacuum packaging scheme for all commercially available microbolometers. Second, heat is lost through radiation. Very little can be done other than the material selection to avoid this form of heat loss. The selection of materials can impact this mechanism. However, the materials that are preferred for low heat loss also absorb less infrared radiation, which is not desirable. This mechanism represents the ultimate limit on the performance of the detector. Third, the heat is lost through thermal conduction through the supporting structure of the thermometer. The design of the supporting structure will minimize the thermal conductance of the structure to the point where the total thermal conductance is dominated by the radiative component only. A nanomesh can minimize the thermal conductance while utilizing its truss-like nature to provide structural support.

The performance of an IR detector for imaging is most commonly described by a parameter called noise-equivalent temperature difference (NETD), which is the measurement of how well a thermal detector can distinguish between slight differences in thermal radiation in the image. The best cryogenically cooled quantum devices can have NETD values below 20 mK. Although no thermal uncooled detector has reached such low values, the theoretical limits of thermal IR detectors operating at ambient temperature are close to the values of cooled quantum detectors for wavelengths above 8 µm. Since thermal noise power increases as the square root of heat conduction, the heat conduction to the environment poses the largest limit in terms of detection. To lower this limit, the thermal bridges between detector to substrate and housing must be minimized. Also, lowering the heat capacity of the detector element by reducing the thickness of the detector structure leads to a large temperature change per radiation input, further reducing the effect of noise. Commercial microbolometers with a lens of an f-number=1 has an NETD value of 35 mK. Micromachining has allowed further improvement of thermal detectors, with the most advanced IR FPAs currently based on microbolometers of vanadium oxide and amorphous silicon, achieving NETD between 25 and 50 mK.

For a thermal detector, the sensitive element is referred to as the thermometer. The thermometer is typically thermally isolated from the substrate to improve the responsivity by suspending it above the substrate using micromachining techniques. The performance of a thermal detector depends upon the thermal capacity $C_{th}$, the rate at which thermal energy is lost through the thermal conductance of the structure, $G_{th}$, and the radiative thermal conductance, $G_{rad}$. The radiative thermal conductance for a gray body, assuming the emissivity is equal to the absorptivity, is given by $G_{rad}=4\eta\sigma AT^3$; where $\eta$ is the average absorption of the detector, $\sigma$ is the Stefan-Boltzmann constant, A is the surface area and T is the absolute temperature. The conductive/convective loss is neglected since the detector is typically operated in vacuum. The temperature change due to a sinusoidally modulated photon flux is given by:

$$\Delta T = \frac{\eta \Phi}{G_{eff}(1+\omega^2 \tau_{th}^2)^{1/2}} \quad (1)$$

Where, $\Phi$ is the radiant energy flux, is the angular modulation frequency of the incident radiation, and is the thermal time constant ($C_{th}/G_{th}$). The effective thermal conductance, $G_{eff}$, is obtained through a heat balance and is given by:

$$G_{eff}G_{th}+G_{rad}\pm\alpha P_{bias} \quad (2)$$

Where, $\alpha$ is the TCR of the thermometer, $P_{bias}$ is the power dissipated in the bias of the detector. The sign of the power bias term depends upon the type of bias. The "+" sign corresponds to the voltage bias case while the "−" sign corresponds to the current bias case. For the case of a semiconductive microbolometer, the TCR is negative, which means that the power dissipated in the detector effectively increases the effective thermal conductance $G_{eff}$.

There are other figures of merits than NETD for microbolometers which are described below:

Temperature Coefficient of Resistance (TCR):

TCR exhibits how rapidly the resistance of the sensing material responds to a change in temperature and can be expressed as $$\alpha = \frac{1}{R}\cdot\frac{dR}{dT} = \frac{1}{R}\frac{\Delta R}{\Delta T} = -\frac{E_a}{kT^2} \quad (3)$$

Here, $E_a$ is the activation energy and k is the Boltzmann constant. TCR is a material property, so the higher the value, the better it is for IR uncooled detection.

Responsivity:

Responsivity is a measure of the dependence of the signal output of a detector upon the input radiant power. The detector output signal may be current or voltage. Thus the voltage responsivity, $R_v$, is defined as the detector output voltage per unit of detector input power.

$$R_v = \frac{\eta\alpha R I_b}{G_{th}(1+\omega^2\tau^2)^{1/2}} \quad (4)$$

Where, $\eta$, $I_b$, $G_{th}$, $\omega$, and $\tau$ are the absorption coefficient, bias current, thermal conductance, angular frequency, and time constant of the device, respectively. The first three terms of the numerator in the right-hand side of equation (4) ($\eta$, $\alpha$ and R) depend on material properties of the microbolometer. Voltage responsivity is expressed in V/W while current responsivity is expressed in A/W. The voltage responsivity of the bolometer can be increased by decreasing the thermal conductance of the structure. The thermal time constant of the microbolometer is in the millisecond range as it involves the thermal mass of the sensing layer which needs to heat up for change in resistance because of IR radiation.

Detectivity:

Detectivity, D*, is the area normalized signal to noise ratio. It has the unit of cmHz$^{1/2}$/W. The detectivity can be expressed by $$D^* = \frac{R_v\sqrt{A_d \Delta f}}{\Delta v_n} \quad (5)$$

where, $\Delta v_n$ is the total noise voltage observed in the electrical bandwidth $\Delta f$ and is the sum of noises from the sensing element of the microbolometer—Johnson noise, random telegraph switching noise, 1/f-noise, generation and recombination noise. Higher responsivity represents higher detectivity.

TABLE I

TCR and other figures of merit of bolometer sensing materials.

| Material | TCR (%/K) | Detectivity (cmHz$^{1/2}$/W) | Responsivity (V/W) | Resistivity (Ω-cm) | Pixel size (μm$^2$) |
|---|---|---|---|---|---|
| V$_2$O$_5$ | 2.8 | 6 × 10$^5$ | 36 | 1.7 | 200 × 800 |
| V$_{0.95}$W$_{0.05}$ | 4.10 | 1 × 10$^9$ | N/A | 40 | N/A |
| a-SiGe | −2 | N/A | N/A | ~40 | N/A |
| Poly-SiGe | −1.91 | 8.3 × 10$^8$ | 15,000 | N/A | N/A |
| poly-SiGe (CVD deposited) | −2 | 2.31 × 10$^9$ | 1.4 × 10$^4$ | N/A | 25 × 25 |
| a-Si:H | 2.8-3.9 | N/A | 1 × 10$^6$ | N/A | 48 × 48 |
| a-Ge$_x$Si$_{1-x}$O$_y$ | −2.27--8.69 | 8.27 × 10$^6$ | 1.05 × 10$^4$ | 4.22 × 10$^2$- 3.47 × 10$^9$ | 40 × 40 |
| Y—Ba—Cu—O | 4.02 | 1.6 × 10$^9$ | 3.8 × 10$^5$ | 32.42 | 7000 × 10000 |

To improve the figures of merits of microbolometers (responsivity, detectivity, NETD) by reducing the thermal conductance, mainly two approaches have been reported:

First and the most common approach includes, separating the sensing and absorber layers using a bridge-like structure. Thus, the sensing layer is suspended above the substrate using the electrode arms which is connected to the substrate. Two types of electrode arms had been reported in this category—the first type includes the straight bridge like structure while the second type includes the serpentine shape of electrode arm. This structure is created using surface micromachining process. Recently, a double-layer microbolometer had been reported which consists of a space filling metal/dielectric sandwich layer designed to capture a maximum amount of incoming radiant heat energy. The end result is an absorber layer which is suspended over the pixel to absorb approximately 95% of the radiation from the 8-14 μm spectrums and hence increase the figures of merits. This extra suspended layer does not decrease the thermal conductance of the structure and is created by using surface micromachining process. The minimum thermal conductance reported for these cases is approximately 2.10×10$^{-7}$ W/K.

The second approach of lowering the thermal conductance is by etching the substrate and thus suspended the sensing layer. This bulk micromachining process is not very effective as it is expensive to implement and does improve the thermal conductance value mentioned in earlier paragraph.

To achieve a radiation limited thermal conductance for a semiconducting microbolometer, the thermal conductance needs to be at least 5×10$^{-9}$ W/K. This represents a significant improvement in the state-of-the-art semiconducting microbolometers or uncooled infrared detectors by over an order of magnitude. By utilizing a truss-like mesh, the supporting structure can maintain mechanical strength as with the mesh pattern and similarly have a low thermal conductance. However, a more compact structure is possible by using nanolithography to pattern the structure. Struts with 100 nm or less width are possible thereby allowing the size of the structure to be dramatically reduced such that an array pitch of 50 μm or less is possible. By utilizing surface micromachining techniques, a high fill factor can also be achievable. The nanomesh truss will form wrap around arms supporting the thermometer above the substrate. The high fill factor will be achieved by this compact arm design combined with an extended thin metal film absorber. This improvement on design had been proposed as part of this application.

It is proposed to utilize Aluminum Oxide (Al$_2$O$_3$) as the structural material of the micromachined semiconducting microbolometers. Al$_2$O$_3$ offers some structural advantages over Si$_3$N$_4$ as it possesses higher yield strength of 15.4 GPa compared to that of Si$_3$N$_4$'s 8.7 GPa. While fabricating the device, direct write e-beam lithography and nanoimprinting will be employed to pattern the high-resolution features of the nano-mesh infrared detectors. Conventional photolithography will be used to pattern the micron scale features of the thermometer and bond pads.

In preferred embodiment, the nano-rings 110 were used here to reduce the thermal conductivity between the sensing layer 107 and the substrate 113. The number of rings used here is 92 which help to reduce the thermal conductance between the sensing layer and the substrate. The preferred embodiment includes design of the microbolometer with struts which includes the effects of strut number; thickness, dimension and width, materials of each of the layers on its thermal conductivity and hence figures of merit. In other embodiments of the invention, the number of rings, thickness, dimension, and width of the nano-rings 110 can vary to maximize the figures of merit of the device.

Thermal conductance of the structure can be defined as:

$$G_{th} = \frac{A}{\Delta T} I \quad (5)$$

Where, A is the area of the absorber, $\Delta T$ is the temperature change and I is the intensity of the heat flux. The microbolometer's performance was determined using a heat flux of 50 pW/μm$^2$. Intellisuite finite element analysis software was used to simulate the structure. The heat flux was applied on top of the absorber 108 which has an umbrella structure. The bottom of the substrate was kept fixed at 25° C. or 298K and it was assumed as the room temperature.

The temperature rise for heat conduction process is related to the path length, L through which the heat flows as, $$\Delta T = \frac{L}{G_{th}} I \quad (6)$$

Figure 4:
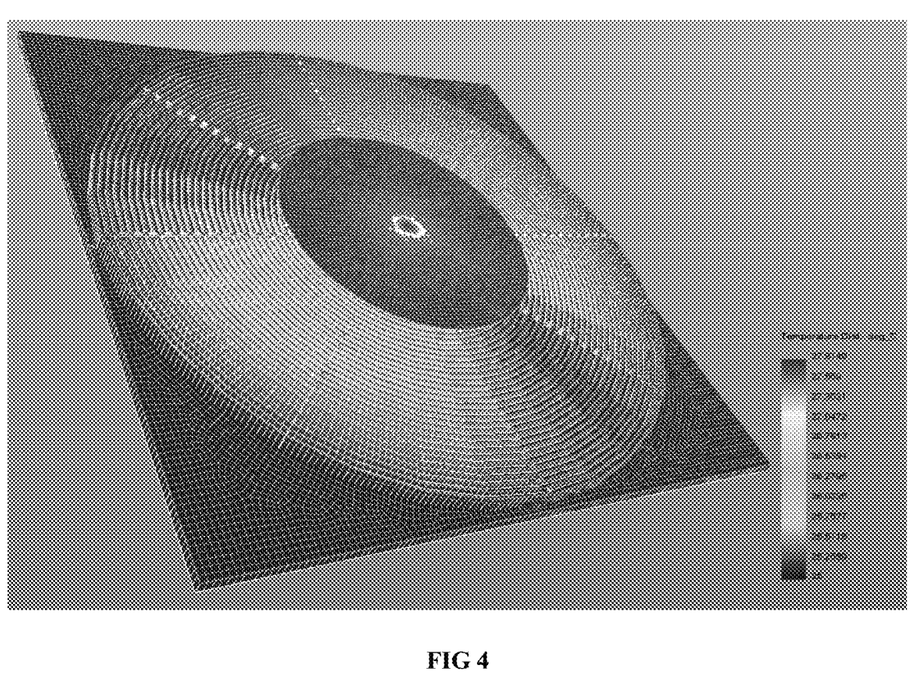
FIG. 4 is the contour of rise in temperature of the device when a heat flux of 50 pW/µm$^2$ was applied on top of the absorber layer.

The temperature rise is directly proportional to the thermal path length and therefore a lower thermal conductance was obtained by making the path length longer. The number of rings or struts used here is inversely proportional to the thermal conductivity between the sensing layer and the substrate. Also, as the number of struts increase, the diameter of the web also increases. Hence the thermal conductance of the microbolometer decreases with the increase in web structure size. For a mesh diameter of 100 μm, we obtained a thermal conductance of $1 \times 10^{-9}$ W/K which is at least one order of magnitude lower than the reported values. This thermal conductance was obtained by using 92 struts. The temperature rise due to the heat flux for the device is shown in FIG. 4. A larger mesh structure of other embodiments corresponds to a longer path length which caused lower thermal conductance. The number of struts has a paramount effect on thermal conductance as addition of struts provided longer thermal path length and hence reduced thermal conductance.

Preferred embodiment also includes the approach of reducing the thermal conductance between the substrate and the sensing layer by reducing the thickness of the electrode layer 109 and making the electrode layer shape 109 meandered. Smaller thickness of the metal electrode layer led to smaller cross-sectional area which provided a higher thermal resistance for conductive heat to transfer. By changing the shape of the metal electrode layer to meandered, the path length of the electrodes is increased for heat to conduct and thus the heat through these metal electrodes were conducting a little heat along with the supporting structure and contributed towards decrease in thermal conductance.

A preferred embodiment also includes a thicker sensing layer 107 which provided longer thermal path that way it helped in temperature rise because of IR absorption which reduced the thermal conductance. The design made a balance between the increase in thermal mass because of thicker sensing layer which tends to increase thermal conductance and the fact mentioned earlier. The lower thermal conductance was found with increasing sensing layer thickness at the end.

Preferred embodiment also includes a thinner web structure 110 which reduces the cross-sectional area of web structure and increases the thermal resistance of conductive heat flow. The decrease in thermal conductance was obtained by decreasing the thickness of the mesh structure 110.

The decrease in thermal conductance was also obtained by decreasing the width of the struts. Again, the decrease in strut width results in smaller cross-sectional area which increases the thermal resistance of the heat conduction and thus reduces thermal conductance.

The substrate material 113 used in preferred embodiments is silicon, due to strong mechanical and electrical properties as well as its common use in almost all CMOS devices. Other embodiments may be created using other materials, but current micromachining and fabrication processes use the mechanical properties of silicon to its advantage.

In a preferred embodiment, Silicon Nitride ($Si_3N_4$) is used as an insulation layer 112, deposited on the silicon substrate 113 to electrically isolate the device. In preferred embodiments, the thickness of the SiN insulation layer ranges from about 0.1 μm to 0.5 μm, with more preferred embodiment having a thickness of 0.2 μm. Other embodiments of the invention can use other electrically insulating material if they are electrically insulated enough to resist electric current flow or pass the voltage along the substrate.

The support structures 110 and 111 are fabricated using $Al_2O_3$ in a preferred embodiment. $Al_2O_3$ has high yield strength of 15.4 GPa compared to the commonly used $Si_3N_4$ (8.7 GPa). However, $Si_3N_4$ may be used in other embodiments due to its optical properties. $Al_2O_3$ also has the transmittance of over 80% in the wavelength ranges 0.2 μm to 7 μm.

With considerations to the sensing material 107, preferred embodiments use Tungsten doped Germanium Silicon Oxide as it has potential to show high TCR as well as high absorption in the wavelengths of interests (3 μm to 5 μm and 8 μm to 14 μm) as sensing layer of microbolometers so they are easily integrated in fabrication processes.

While Tungsten doped Germanium Silicon Oxide may be used for preferred embodiments, many forms as well as other materials can also be used in other embodiments as the sensing layer 107. These materials can include, but are not limited to: $V_2O_5$, $V_{0.95}W_{0.05}$, a-SiGe, poly-SiGe, a-Si:H, a-$Ge_xSi_{1-x}O_y$, and Y—Ba—Cu—O.

The absorber layer 108 that rests on top of the sensing layer 107 is made of NiCr in a preferred embodiment. Also, in a preferred embodiment, the thickness of the absorber layer is 0.2 μm and the layer is a circular disk with a diameter of 25 μm. However, in different embodiments, other metals can be used as the absorber layer. The thickness and diameter of the disc can be altered with minor change to the invention in other embodiments. Although in preferred embodiments the absorber layer is round, in other embodiments it may be any other shape.

In current work, the thermal conductance obtained from the design is $8.8 \times 10^{-9}$ W/K which is at least one order of magnitude less than the current reported values for thermal conductance of semiconducting uncooled microbolometers.

DETAILED DESCRIPTION OF THE DRAWINGS

FIGS. 1A and 1B are the 3D and cross sectional view of the microbolometer from prior art to show the bolometer structure and surface micromachining techniques to separate the sensing layer from the substrate with an air cavity.

Figure 2A:
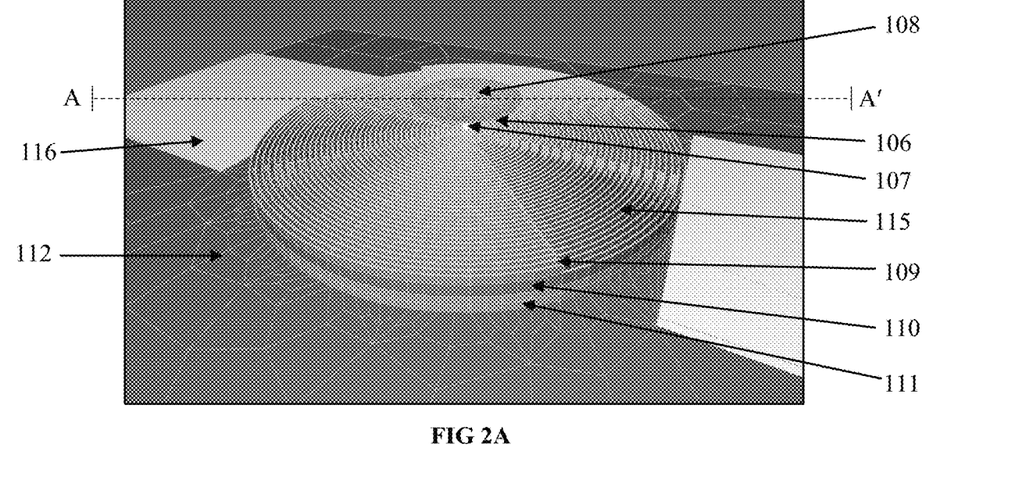
Figure 2B:
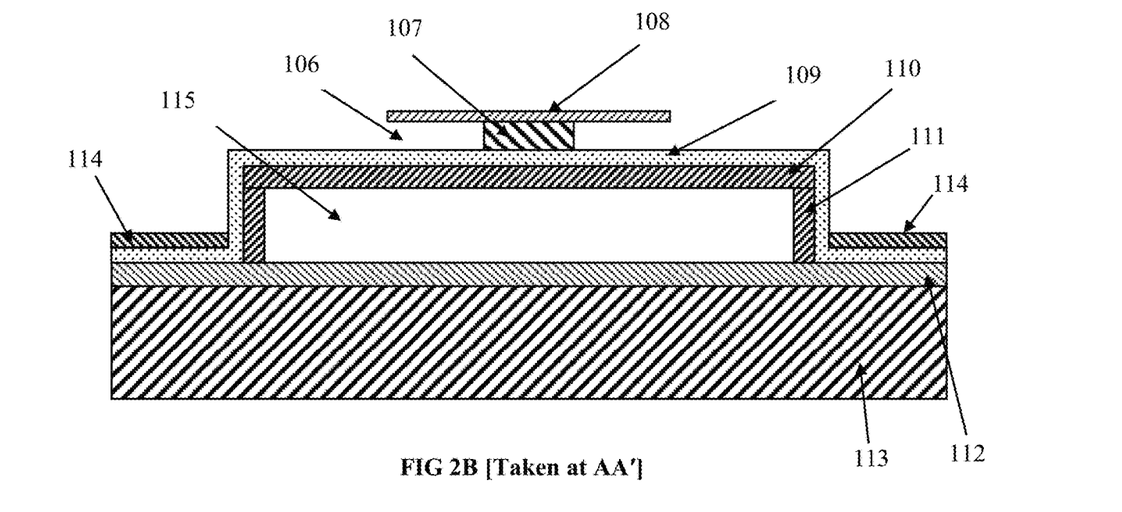
FIG. 2B is the cross-sectional view of the individual bolometer design.

FIG. 2A and FIG. 2B are the 3D and cross sectional views of the bolometer, respectively, showing the raised mesh design of the whole device with $Al_2O_3$ support layer. 108 is the absorber layer which consists of NiCr (Atomic Concentration-80% Ni and 20% Cr). Thickness of this layer is 0.2 μm and diameter is 50 μm. The layer is deposited by sputtering, evaporation or any other thin film deposition technique. This absorber layer helps to absorb the IR radiation in the targeted wavelengths (3-5 μm and 8-14 μm) and transfers that heat to sensing layer 107 of microbolometer. The layer is suspended over the sensing layer using the surface micromachining process. 107 represents the sensing layer of the microbolometer whose resistance changes due to heating or cooling. In other embodiments, the sensing layer could be metal doped (Tungsten, Tin, etc.) or undoped Germanium Silicon Oxide and other materials which include, but are not limited to: $V_2O_5$, $V_{0.95}W_{0.05}$, a-SiGe, poly-SiGe, a-Si:H, a-$Ge_xSi_{1-x}O_y$, and Y—Ba—Cu—O. The sensing layer could be deposited by sputtering, chemical vapor deposition or other techniques depending on the type of material used and embodiment of the device. The sensing layer's thickness is 2 μm and has the dimension of 10 μm×10 μm and is patterned by using lift off technique. 109 is the metal electrode layer which have lower thermal conductivity but higher electrical conductivity such as NiCr or Ti in preferred embodiments. The thickness of this layer is 1 μm and the width is 100 nm for preferred embodiments. This layer is patterned by using electron beam lithography. 111 represents the bottom support ring of the invention, which suspends the top support mesh 110 over the bottom cavity 115. The bottom support is 2 μm in thickness and 100 nm in width in preferred embodiments. This is the only layer which is connected with the substrate 113 and is also patterned by using electron beam lithography. 110 represent the top support structure with struts or rings made of $Al_2O_3$ that provide the support of the structure. There exists a total of 92 rings in preferred embodiments which helps structurally and minimizing the thermal conductance. Thickness of preferred embodiments of this layer is 1 μm and width of each ring is 100 nm and is patterned by electron beam lithography.

Figure 3A:
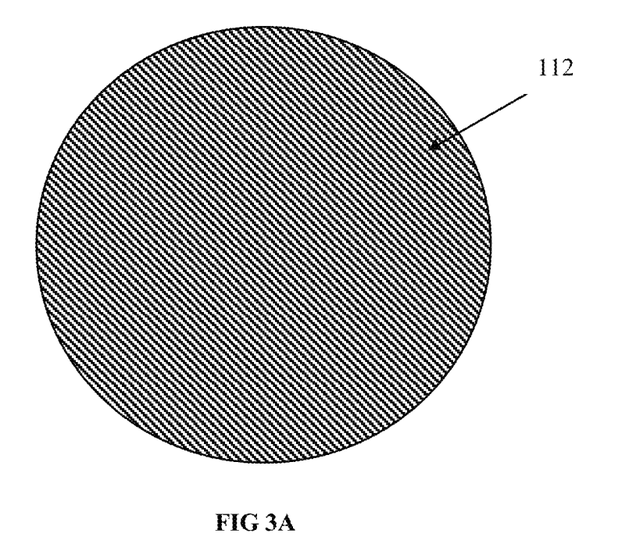
FIG. 3A is the top view of the substrate and insulating layer.
Figure 3B:
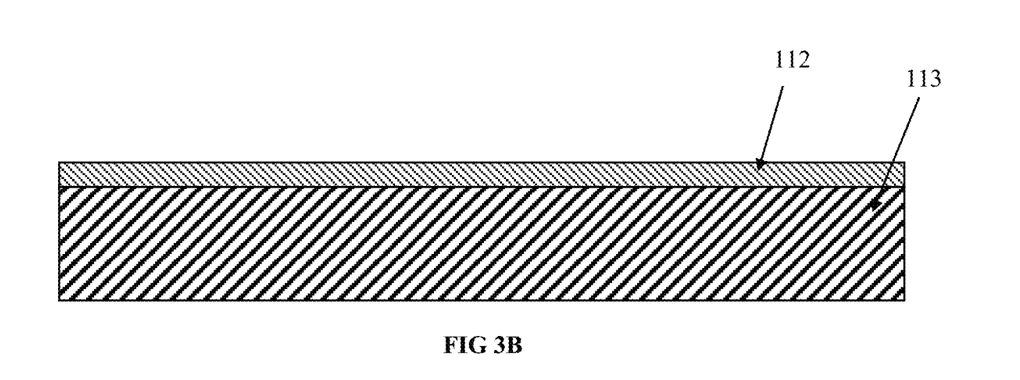
FIG. 3B is the cross-sectional view of the substrate and insulating layer.

FIG. 3A and FIG. 3B are top and cross sectional views of the substrate and the insulating layer of the microbolometer, respectively. The invention is fabricated on a clean wafer 113 prepared for spin coating with acetone, methanol, and isopropyl. The substrate or base 113, acting as the first layer in the invention design. In the preferred embodiment, this layer could be Si or other flexible substrates on which the bolometer sensor is fabricated. Thickness of the substrate could be anywhere between 200 μm to 1000 μm depending on type of substrate used. The substrate is needed to provide the support for the device. A flexible substrate is needed when the bolometer needs to mount the bolometer on a conformal surface. The insulating layer 112 is needed to isolate the substrate from the subsequent layers. This layer also protects the substrate from any chemical reaction while etching or fabricating other layers during the fabrication process. In the preferred embodiment, the insulating layer is made of SiN which has an excellent adhesion with Si or other substrate layer. In fabrication for preferred embodiments, 0.2 μm thick SiN insulating layer 112 is deposited via radio frequency (RF) sputtering. There is no need to pattern this layer.

Figure 3C:
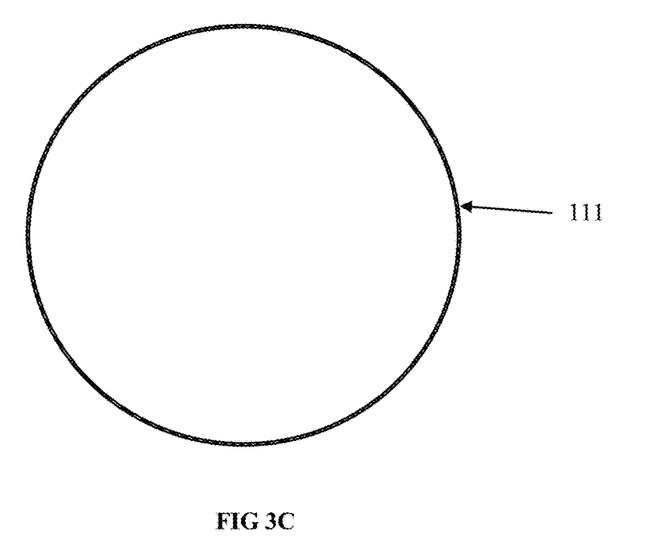
FIG. 3C is the top view of the bottom support layer of the microbolometer.
Figure 3D:
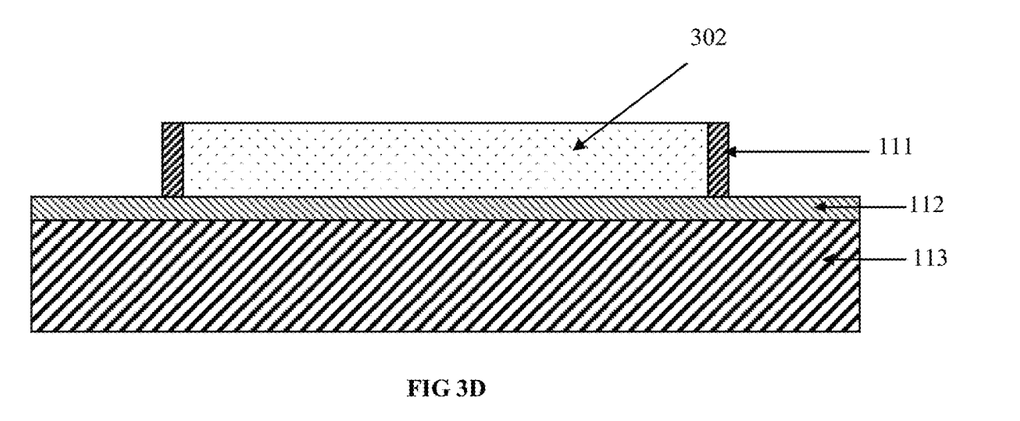
FIG. 3D is the cross-sectional view of the bottom support layer and the first photo sacrificial layer.

FIG. 3C and FIG. 3D show the top and cross sectional views of the bottom support of the microbolometer 111, respectively, as well as the first sacrificial layer 302. In a preferred embodiment, a 4.5 μm thick (initial) layer 302 of photodefinable PI 2610 is spin coated, patterned, and cured to a thickness of 2.2 μm. The $Al_2O_3$ bottom support layer 111 is deposited by electron beam lithography. For a preferred embodiment, the thickness of the bottom support layer 111 is 2 μm with a critical dimension of 100 nm This bottom support the last ring of the mesh which is located at a distance of 100 μm from the center of the microbolometer. This layer is deposited by sputtering or other suitable methods of thin film deposition and patterned by electron beam lithography.

Figure 3E:
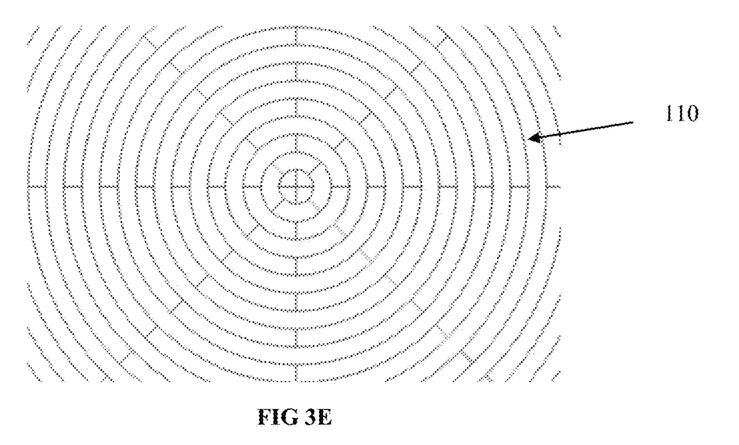
FIG. 3E is the top view of the top support layer, which has 92 struts and a strut-based mesh design.
Figure 3F:
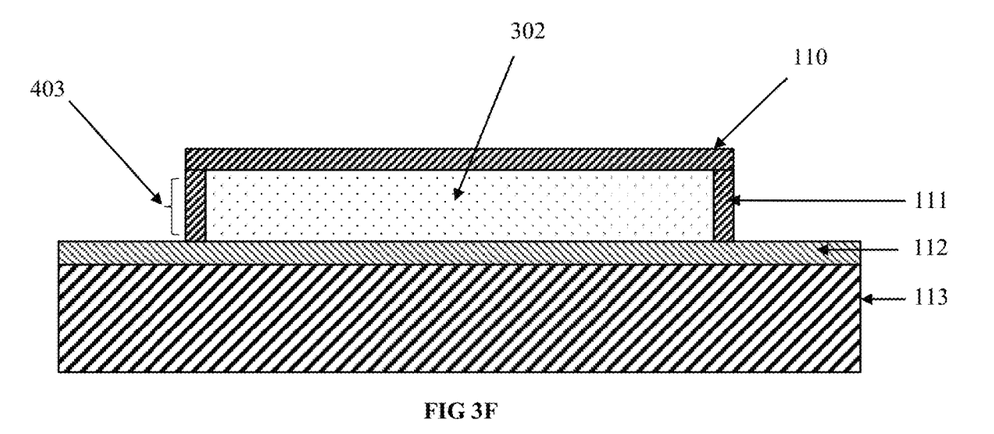
FIG. 3F is the cross-sectional view of the top mesh-shaped support fabricated on the sacrificial layer.

In FIG. 3E and FIG. 3F show the top and cross-sectional views of the top $Al_2O_3$ support layer of the microbolometer 110 with 92 struts and a strut-based mesh design. The top $Al_2O_3$ support layer 110 is deposited by electron beam lithography and will have a thickness 403 of 1 μm and a critical dimension of 100 nm for preferred embodiments. Due to the number of struts, its structure, and dimension of the top support layer 110, the reduction in thermal conductance is achieved, thus improving the bolometer's figures of merits, including the reduction of thermal conductance below the maximum required value of $5 \times 10^9$ W/K. This layer is deposited by sputtering or other suitable methods of thin film deposition and patterned by electron beam lithography. This layer is suspended above the substrate by the bottom support layer 111. Sacrificial layer 302 is used to provide the support for depositing this layer. In the final fabrication process, this layer will be suspended above the substrate by etching it. The circular shape and interconnected structure of the top support layer 110 increases the path length of heat conduction which is received through the sensing layer 107 and electrode arm layer 109 and contributes towards the reduction of thermal conductance of the uncooled infrared bolometer.

Figure 3G:
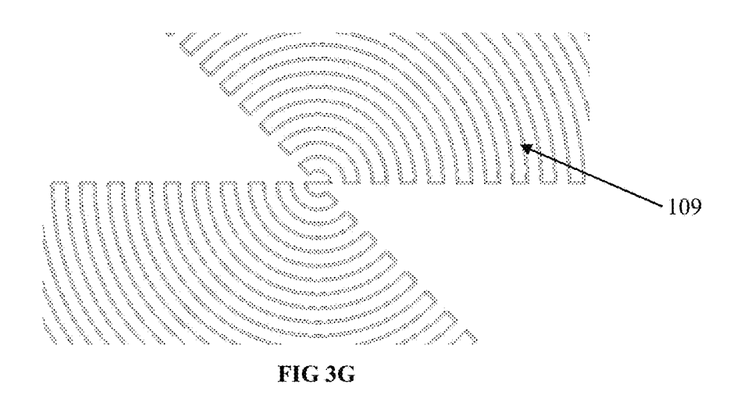
FIG. 3G is the top view of the electrodes with a meandered design to follow the top support structure.
Figure 3H:
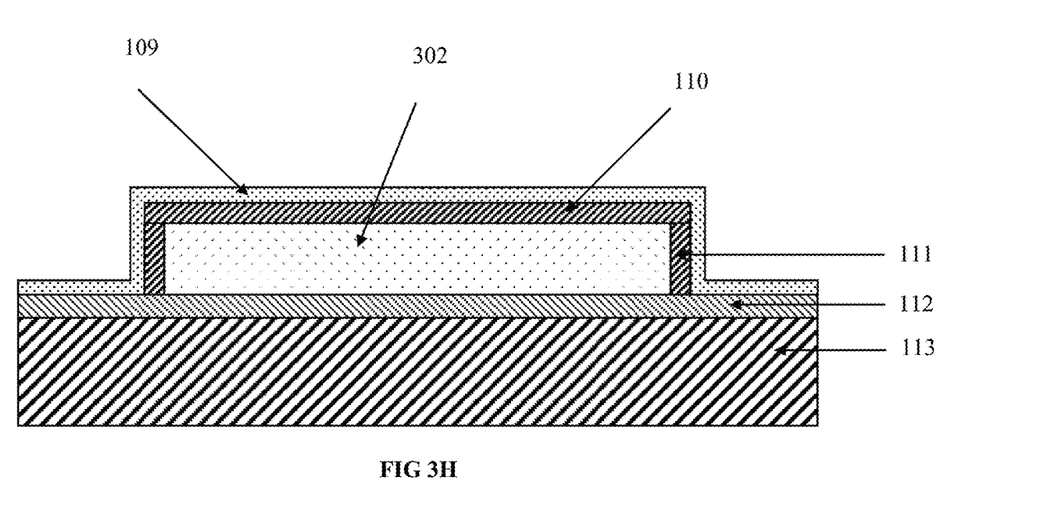
FIG. 3H is the cross-sectional view of the electrode layer fabricated on top of the top support layer and extending out to the insulating layer.

FIG. 3G and FIG. 3H show the top-down and cross sectional views of the electrode layer 109, respectively. For a preferred embodiment, the electrode layer 109 of thickness 0.5 μm and critical dimension of 100 nm will be deposited via electron beam lithography. In preferred embodiments, the electrodes will be made of Ti, NiCr, or other electrically conductive materials, and will have a meandered design that traces the top $Al_2O_3$ support layer 110. The meandered structure and design of the electrode arm layer increased the path length of this electrode arm layer and contribute towards decrease in thermal conductance.

Figure 3I:
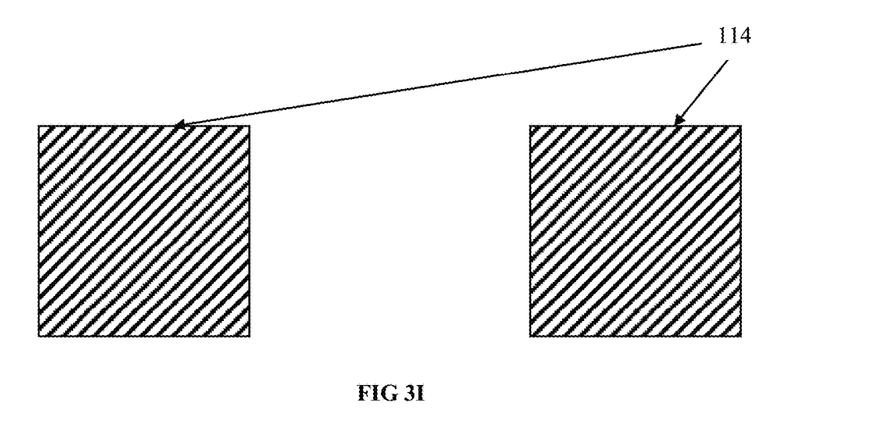
FIG. 3I is the top down view of the bond pad to carry electrical signal away from the bolometer for further processing.
Figure 3J:
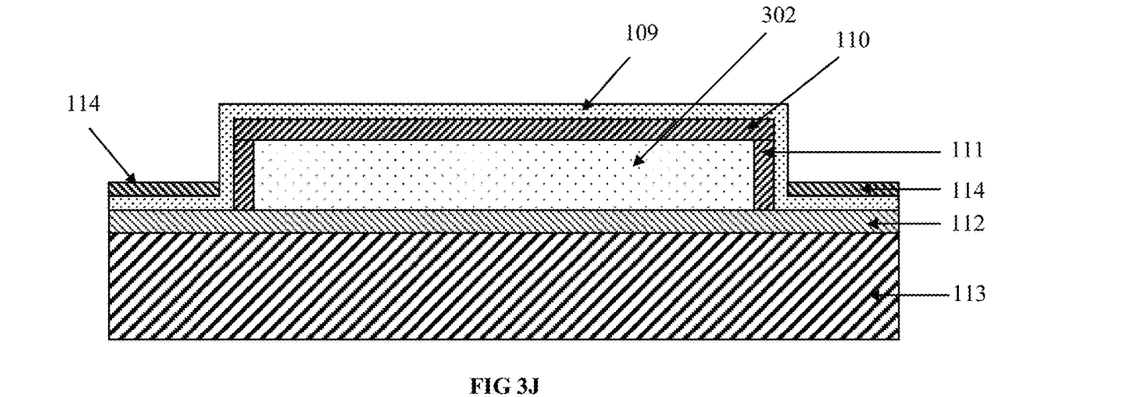
FIG. 3J is the cross-sectional view of the bond pad layer after deposition and patterning on the bolometer.

FIG. 3I and FIG. 3J show top-down and cross-sectional views of the bond pad 114 to carry electrical signal away from the bolometer. This layer is the interface between the microbolometer sensor and readout circuitry. In preferred embodiments, the material used for this layer is Al, Au, Al, NiCr, Ti, or other electrically conductive material. In fabrication, negative photoresist will then be applied via spin coating for material deposition. The resist will be patterned to the bond pad design and the material will be deposited via RF sputtering. Lift off will then be performed in an acetone bath to remove excess photoresist and material. The bond pads 114 will be 150 μm×150 μm squares positioned on the left and right side of the detector with a thickness of 0.5 μm, for preferred embodiments.

Figure 3K:
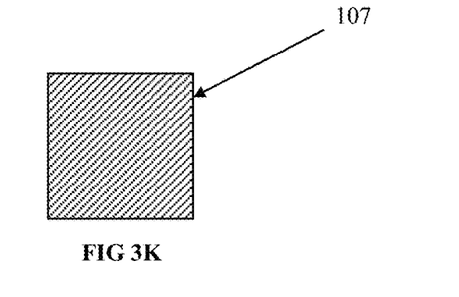
FIG. 3K is the top down view of the bolometer sensing layer of dimensions 10 µm×10 µm and thickness of 2 µm.
Figure 3L:
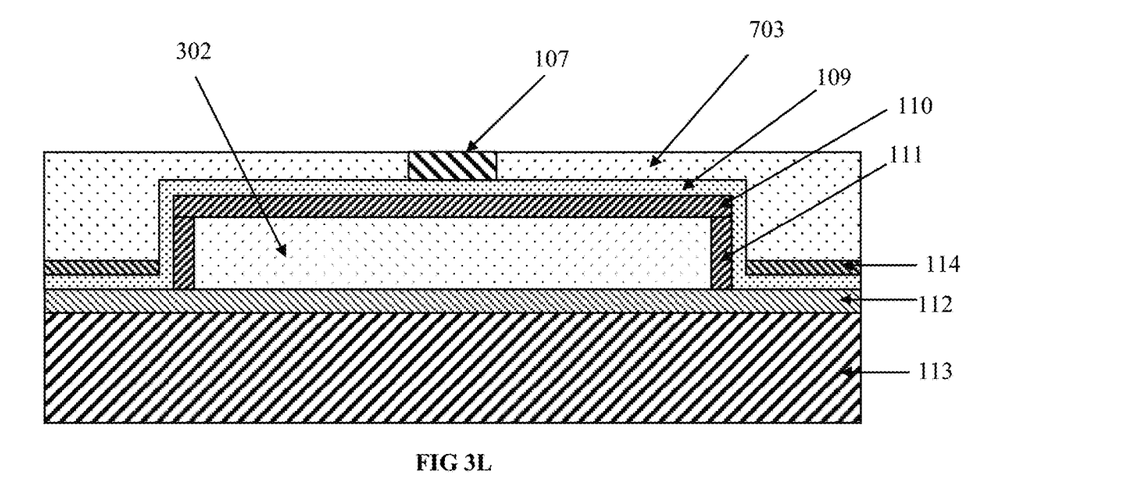
FIG. 3L is the cross-sectional view of the bolometer sensing material of the dimensions of FIG. 3K patterned on the bolometer after depositing the second sacrificial layer.

FIG. 3K and FIG. 3L show the top-down and cross-sectional views, respectively, of the bolometer sensing layer 107 with dimensions of 10 μm×10 μm and thickness of 2 μm in a preferred embodiment. In preferred embodiments, a second sacrificial layer 703 is deposited by a suitable method, patterned by optical lithography to obtain a thickness of 2.2 μm. Then the bolometer sensing material 107 is deposited and patterned using liftoff process. The electrical resistance of this layer changes because of heating or cooling of the material. In preferred embodiments, the sensing layer 107 could be metal doped (Tungsten, Tin etc) or undoped Germanium Silicon Oxide and other materials which include, but are not limited to: $V_2O_5$, $V_{0.95}W_{0.05}$, a-SiGe, poly-SiGe, a-Si:H, a-$Ge_xSi_{1-x}O_y$, and Y—Ba—Cu—O. In preferred embodiments, the sensing layer 107 could be deposited by sputtering, chemical vapor deposition or other techniques depending on the type of material used. The sensing layer is patterned by using lift off technique.

Figure 3M:
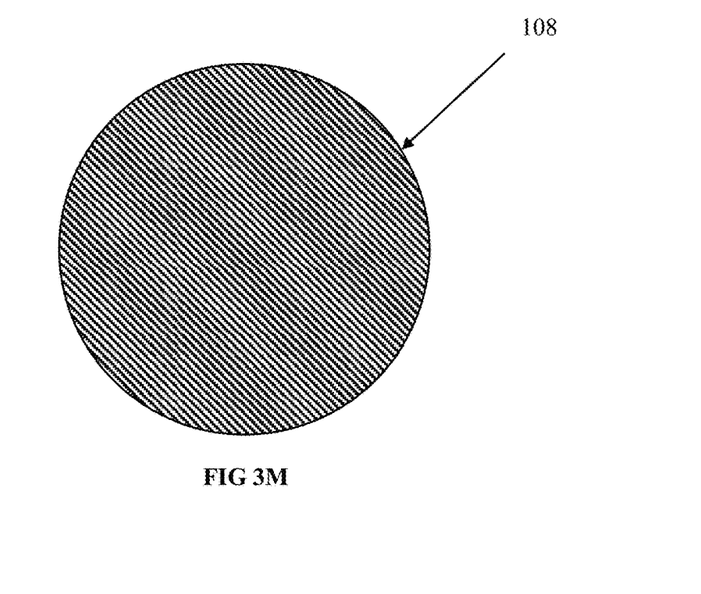
FIG. 3M is the top view of the absorber layer, with a circular dimension of radius 25 µm and thickness of 0.2 µm.
Figure 3N:
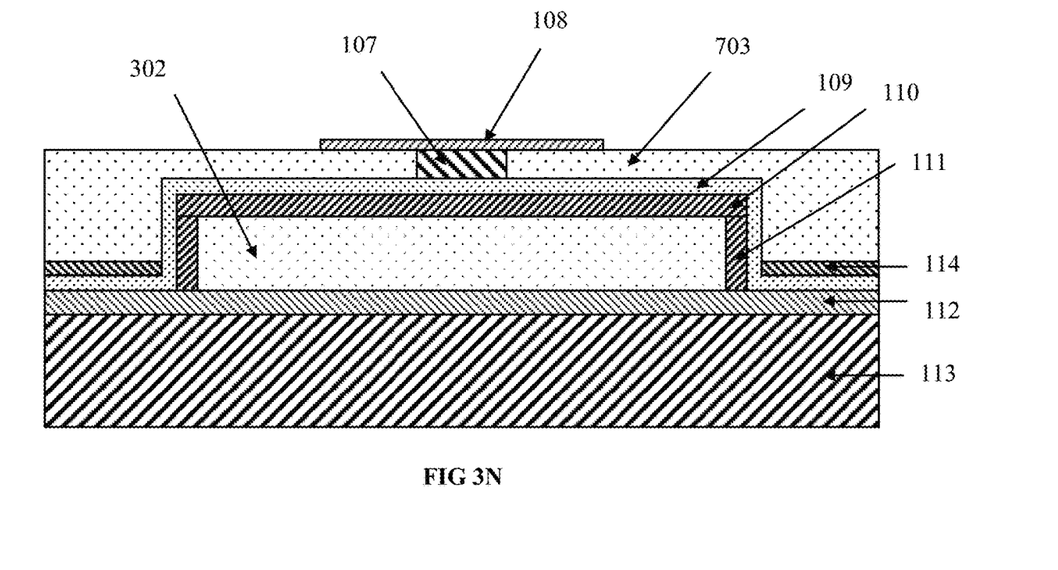
FIG. 3N is the cross-sectional view of the absorber layer with the dimensions of FIG. 3M, patterned on top of both the second sacrificial layer and the bolometer sensing layer.

FIG. 3M and FIG. 3N show the top-down and cross-sectional views, respectively, of the NiCr absorber layer 108, which helps to absorb the IR radiation in the targeted wavelengths of 3-5 μm and 8-12 μm. Preferred embodiments use photolithography techniques for fabrication. Photo definable polyimide or other sacrificial layer material 703 is used to provide structural support during the fabrication process. Negative photo resist is applied on top of the sensing layer 107 and sacrificial layer 703 by spin coating. The resist will be patterned using conventional photolithography with the NiCr photomask design 108 and will be developed. A NiCr layer will be deposited by sputtering or evaporation, and lift off will be performed using an acetone bath to remove excess photoresist and NiCr, leaving the circular absorber 108 of radius 25 μm and thickness of 0.2 μm in a preferred embodiment. The sacrificial layer 302 is patterned using conventional photolithography. In a preferred embodiment, the final thickness of the sacrificial layer 302 achieved after the curing process is 2.2 μm and has a dimension of 100 μm. At the end of the fabrication process, the sacricial layers will be removed by a suitable etching, leaving process leaving the cavities 106 and 115 and the finished detector shown in FIG. 2A and FIG. 2B

FIG. 4 is the contour of rise in temperature of the device when a heat flux of 50 pW/μm$^2$ was applied on top of the absorber layer.

We claim:

1. A semiconducting microbolometer in which resistance is changed due to absorbance of radiation, comprising of:
   a substrate,
   an insulating layer on the substrate,
   a lower cavity on the insulating layer,
   a lower support layer on the insulating layer,
   an upper support layer on the lower support layer and the lower cavity,
   a sensing layer on the upper support layer,
   an upper cavity on the upper support layer,
   an absorption layer on the upper support layer,
   wherein the sensing material is tungsten doped germanium silicon oxide.

2. The semiconducting microbolometer of claim 1, wherein the substrate is made of Si, Polymer, GaAs, Ge, Al$_2$O$_3$ or other substrate material and has a thickness between 100 μm and 1000 μm.

3. The semiconducting microbolometer of claim 1, wherein the insulating layer has a thickness between 0.1 μm and 3 μm and is made of oxide and/or nitride.

4. The semiconducting microbolometer of claim 1, wherein the lower cavity is formed using the sacrificial layer of polymer, SiN or other material; and has a height between 2 μm to 4 μm.

5. The semiconducting microbolometer of claim 1, wherein the lower support layer has a thickness of 2 μm and a critical dimension between 60 nm and 120 nm.

6. The semiconducting microbolometer of claim 1, wherein the lower support layer supports the upper support layer above an air cavity and is made of Al2O3, SiN or an insulating material.

7. The semiconducting microbolometer of claim 1, wherein the upper support layer is on the lower support layer above an air cavity and is made of Al2O3, SiN or an insulating material.

8. The semiconducting microbolometer of claim 1, wherein the upper support layer is a mesh like design structure made of Al2O3.

9. The semiconducting microbolometer of claim 1, wherein the upper support layer has a thickness of 1 μm and a critical dimension between 60 nm and 120 nm and includes about 50 to 100 struts to minimize thermal conductance of the device below 5×109 W/K.

10. The semiconductor microbolometer of claim 1, wherein the semiconductor microbolometer comprising a top electrode; and the top electrode is made of material which has high electrical conductivity but low thermal conductivity.

11. The semiconducting microbolometer of claim 1, wherein the upper cavity has a height between 2 μm and 4 μm and formed using the sacrificial layer of polymer, SiN or an insulating material.

12. The semiconducting microbolometer of claim 10, wherein the top electrode layer is Ti, NiCr, Cu, Au, or any electrically conductive metal, and is about 0.5 μm in thickness and a critical dimension is between 60 nm and 120 nm.

13. The semiconducting microbolometer of claim 1, wherein the absorber layer is made of NiCr or Au-black in a disk shape, with a thickness of about 0.2 μm and a diameter of 25 μm.

14. The semiconducting microbolometer of claim 1, wherein the semiconductor microbolometer comprising of bondpads and the bondpads are formed with high electrical conductive material.

15. The semiconducting microbolometer of claim 1, wherein the sensing material has high TCR, low resistivity and stable IR radiation.

16. The semiconducting microbolometer of claim 1, wherein the absorption layer has high absorption in MWIR and LW IR regions.

17. The semiconducting microbolometer of claim 1, wherein the lower support layer and the upper support layer are made of insulating material having low thermal conductance, and transmittance of the lower upper support layer is at least 60% between the wavelength range 0.2 μm to 7 μm.

18. A method of fabricating a microbolometer in which resistance is changed due to absorbance of radiation, the method comprising of:
   providing a substrate,
   forming an insulating layer on the substrate,
   forming a lower cavity on the insulating layer,
   forming a lower support layer on the insulating layer,
   forming an upper support layer on the lower support layer and the lower cavity, 4
   forming a sensing layer on the upper support layer,
   forming an upper cavity on the upper support layer,
   forming an absorption layer on the upper support layer,
   wherein the sensing material is tungsten doped germanium silicon oxide.

19. The method of fabricating the microbolometer of claim 18, wherein a polyimide sacrificial layer is patterned by photolithography on the insulating layer to form a base for the upper support layer and the polyimide sacrificial layer is removed by ashing.

20. The method of fabricating the microbolometer of claim 18, wherein the lower support layer is formed on top of the insulating layer by electron beam lithography.

21. The method of fabricating the microbolometer of claim 18, wherein the upper support layer is fabricated by electron beam lithography on top of the lower support layer, and forming the lower cavity between the upper support layer and the insulating layer.

22. The method of fabricating the microbolometer of claim 18, wherein electrodes are formed on top of the upper support layer using electron beam lithography, and positioned between the sensing layer and extending in a meandered shape, tracing the top support design to the ends of the detector design.

23. The method of fabricating the microbolometer of claim 18, wherein the sensing layer is on top of the upper support layer between two electrodes.

24. The method of fabricating the microbolometer of claim 18, wherein a second polyimide sacrificial layer is fabricated by photolithography on top of the upper support layer and height of the upper support layer is in line with the top of the sensing layer in order to form a base for fabricating an absorber layer disk and the second polyimide sacrificial layer is removed by ashing.

25. The method of fabricating the microbolometer of claim 18, wherein two bond pads positioned on opposite sides of the detector on the insulating layer.

26. The method of fabricating the microbolometer of claim 18, wherein an absorber layer disk is positioned on top of the sensing layer.

27. The method of fabricating the microbolometer of claim 18, wherein the substrate is made of Si, Polymer, GaAs, Ge, Al2O3 or other substrate material and has a thickness between 100 µm and 1000 µm.

28. The method of fabricating the microbolometer of claim 18, wherein the insulating layer has a thickness between 0.1 µm and 3 µm and is made of oxide and/or nitride.

29. The method of fabricating the microbolometer of claim 18, wherein the lower cavity is formed using the sacrificial layer of polymer, SiN or other material; and has a height between 2 µm to 4 µm.

30. The method of fabricating the microbolometer of claim 18, wherein the lower support layer has a thickness of 2 µm and a critical dimension between 60 nm and 120 nm.

31. The method of fabricating the microbolometer of claim 18, wherein the lower support layer supports the upper support layer above an air cavity and is made of Al2O3, SiN or an insulating material.

32. The method of fabricating the microbolometer of claim 18, wherein the upper support layer is on the lower support layer above an air cavity and is made of Al2O3, SiN or an insulating material.

33. The method of fabricating the microbolometer of claim 18, wherein the upper support layer is a mesh like design structure made of Al2O3.

34. The method of fabricating the microbolometer of claim 18, wherein the upper support layer has a thickness of 1 µm and a critical dimension between 60 nm and 120 nm and includes about 50 to 100 struts to minimize thermal conductance of the device below 5×10-9 W/K.

35. The method of fabricating the microbolometer of claim 18, wherein the semiconductor microbolometer comprising a top electrode; and the top electrode is made of material which has high electrical conductivity but low thermal conductivity.

36. The method of fabricating the microbolometer of claim 18, wherein the upper cavity has a height between 2 µm and 4 µm and formed using the sacrificial layer of polymer, SiN or an insulating material.

37. The semiconducting microbolometer of claim 35, wherein the top electrode layer is Ti, NiCr, Cu, Au, or any electrically conductive metal, and is about 0.5 µm in thickness and a critical dimension is between 60 nm and 120 nm.

38. The method of fabricating the microbolometer of claim 18, wherein the absorber layer is made of NiCr or Au-black in a disk shape, with a thickness of about 0.2 µm and a diameter of 25 µm.

39. The method of fabricating the microbolometer of claim 18, wherein the semiconductor microbolometer comprising bondpads and the bondpads are formed with high electrical conductivity material.

40. The method of fabricating the microbolometer of claim 18, wherein the sensing material has high TCR, low resistivity and stable IR radiation.

41. The method of fabricating the microbolometer of claim 18, wherein the absorption layer has high absorption in low and mid wave IR regions.

42. The method of fabricating the microbolometer of claim 18, wherein the lower support layer and the upper support layer are made of insulating material having low thermal conductance, and transmittance of the lower upper support layer is at least 60% between the wavelength range 0.2 µm to 7 µm.

* * * * *

UNITED STATES PATENT AND TRADEMARK OFFICE
CERTIFICATE OF CORRECTION

PATENT NO. : 10,483,416 B2
APPLICATION NO. : 15/792239
DATED : November 19, 2019
INVENTOR(S) : Mukti Rana and Andrew Bodhi Voshell Page 1 of 1

It is certified that error appears in the above-identified patent and that said Letters Patent is hereby corrected as shown below:

In the Specification

At Column 1, Line 5, please insert:
--This invention was made with government support under the following grant numbers: FA9550-18-1-0283 awarded by the Airforce Office of Scientific Research; NNX-15AP84A awarded by NASA MIRO; N00014-16-1-2727 and N000141512812 awarded by the Office of Naval Research; and 1427089 and 1240267 awarded by the National Science Foundation. The government has certain rights in the invention.--

Signed and Sealed this
Fifth Day of March, 2024

Katherine Kelly Vidal
*Director of the United States Patent and Trademark Office*